United States Patent
Grabowski et al.

(10) Patent No.: US 6,305,602 B1
(45) Date of Patent: Oct. 23, 2001

(54) LIGHT MONITORING SYSTEM AND METHOD FOR AUTOMATED TRANSACTION MACHINE

(75) Inventors: Daniel P. Grabowski, Indian Springs; Jerry Hoskinson, Bolivar; Larry Mannella, North Canton, all of OH (US)

(73) Assignee: Diebold, Incorporated, North Canton, OH (US)

( * ) Notice: Subject to any disclaimer, the term of this patent is extended or adjusted under 35 U.S.C. 154(b) by 0 days.

(21) Appl. No.: 09/198,078

(22) Filed: Nov. 23, 1998

(Under 37 CFR 1.47)

Related U.S. Application Data

(60) Provisional application No. 60/067,010, filed on Dec. 1, 1997.

(51) Int. Cl.[7] .............................. G06F 17/60; G06K 7/00
(52) U.S. Cl. ............................................. 235/379; 235/455
(58) Field of Search ................................... 235/375, 379, 235/380, 381, 382, 462.02, 454, 455, 472.01

(56) References Cited

U.S. PATENT DOCUMENTS

| | | |
|---|---|---|
| 287,654 | 10/1883 | Freeman . |
| 2,926,344 | 2/1960 | Koehler . |
| 2,980,898 | 4/1961 | Mason et al. . |
| 3,054,991 | 9/1962 | Howell . |
| 3,712,142 | 1/1973 | Stucki . |
| 3,719,937 | 3/1973 | Doyle . |
| 3,735,396 | 5/1973 | Getchell . |
| 3,829,735 | 8/1974 | Berlock et al. . |
| 4,295,079 | 10/1981 | Otsuka et al. . |
| 4,354,181 | 10/1982 | Spletzer . |
| 4,396,868 | 8/1983 | Watanabe et al. . |
| 4,422,068 | 12/1983 | Helft et al. . |
| 4,462,022 | 7/1984 | Stolarczyk . |
| 4,507,654 | 3/1985 | Stolarczyk et al. . |
| 4,700,126 | 10/1987 | Hill . |
| 4,812,827 | 3/1989 | Scripps . |
| 5,023,923 | * 6/1991 | Sanner et al. ..................... 382/61 |
| 5,034,659 | 7/1991 | Taniguchi . |
| 5,057,814 | 10/1991 | Onan et al. . |
| 5,061,997 | 10/1991 | Rea et al. . |
| 5,095,502 | 3/1992 | Finzel . |
| 5,099,177 | 3/1992 | Taniguchi et al. . |
| 5,142,130 | * 8/1992 | Sato ..................... 235/462 |
| 5,168,198 | 12/1992 | Watanabe . |
| 5,248,872 | * 9/1993 | Steward ..................... 235/468 |
| 5,359,325 | 10/1994 | Ford et al. . |
| 5,451,843 | 9/1995 | Kahn et al. . |
| 5,471,201 | 11/1995 | Cerami et al. . |
| 5,541,585 | * 7/1996 | Duhame et al. ............ 340/825.69 |
| 5,602,375 | * 2/1997 | Sumahara et al. ............ 235/384 |
| 5,612,531 | * 3/1997 | Barkan ..................... 235/462 |
| 5,619,185 | 4/1997 | Ferraro . |
| 5,637,964 | 6/1997 | Hakkarainen et al. . |
| 5,640,143 | 6/1997 | Myron et al. . |
| 5,672,858 | * 9/1997 | Li et al. ..................... 235/462 |
| 5,682,030 | * 10/1997 | Kubon ..................... 234/462 |
| 5,774,052 | 6/1998 | Hamm et al. . |

FOREIGN PATENT DOCUMENTS 0236147    1/1987   (EP) .

* cited by examiner

*Primary Examiner*—Thien M. Le
(74) *Attorney, Agent, or Firm*—Ralph E. Jocke

(57) ABSTRACT

A light monitoring system (10) senses light levels in an area (20) adjacent to an automated transaction machine (12). The system includes a light source (16, 18). Light levels are sensed by remote units (22, 24, 26). Upon sensing that light levels have fallen below a set threshold, a remote unit transmits a wireless signal to a control unit (30). The control unit (30) communicates with a remote monitoring unit (32) to provide an indication of the sensed condition.

37 Claims, 4 Drawing Sheets

LIGHT MONITORING SYSTEM AND METHOD FOR AUTOMATED TRANSACTION MACHINE

This application claims benefit of U.S. provisional application Serial No. 60/067,010, filed Dec. 1, 1997.

TECHNICAL FIELD

This invention relates in general to automated transaction machines. Specifically, this invention relates to an interactive automated banking machine system for monitoring light levels in the area adjacent to an automated banking machine or other machine or installation and making appropriate responses thereto.

BACKGROUND ART

Automated transaction machines are well known in the prior art. A common type of automated transaction machine is an automated teller machine (ATM). ATMs are used by customers to conduct banking transactions. Common banking transactions conducted at ATMs include dispensing cash, making deposits and transferring funds between accounts. Other types of automated transaction machines include for example, automated ticketing machines, automated fuel dispensing machines, night depositories, machines for enabling use of items for a fee such as airport luggage carts or rental cars and automated gaming machines. For purposes of this disclosure any machine that carries out transactions involving transfers of value shall be considered an automated transaction machine. While the exemplary embodiment of the invention is described herein with reference to an ATM, it should be understood that the invention applies to use with all types of automated transaction machines.

There are a number of different ways in which ATMs have been installed. Often, ATMs are positioned in the lobby of a building. The building may be a bank or another type of structure such as a grocery store, retail store, restaurant or entertainment facility. ATMs are sometimes installed within a special room or vestibule within a building. Such vestibules may include provisions for limiting access to customers who possess a card of the type used to operate the ATM.

ATMs have also been installed in ways that enable customers positioned outside of a building to operate the ATM. ATMs may be installed in a way that enables a customer to operate the machine while standing outside of an exterior wall of the building. Other ATMs are mounted in a drive-up configuration. ATMs mounted in a drive-up configuration enable a customer to operate the ATM while seated in their automobile.

In many types of ATM installations, supplemental light sources which provide light from a source other than the sun, are provided for illuminating the area adjacent to the ATM. For ATMs mounted in a vestibule, this may include light sources provided within the interior of the vestibule. In addition, light sources outside the vestibule may be provided. This is sometimes desirable if the vestibule is directly accessible from an exterior area of a building. Light sources may also be provided which illuminate an area or a pathway that a customer will travel from a public access way such as a parking lot or sidewalk, to the vestibule. These supplemental light sources are operated by control systems which are operated responsive to timers, light sensors and the like.

Supplemental light sources are also generally provided when an ATM is mounted in a drive-up or walk-up configuration. Lighting is generally provided so that the customer may operate the machine at night. In addition, lighting is often provided in the surrounding area through which the customer travels to reach the machine. This may include, for example, a sidewalk on the premises of the bank or other facility along which a customer may walk to reach the machine. Alternatively, supplemental light sources may be provided in driveways or parking lots through which a customer may travel either on foot or in their car to access a drive-up or walk-up ATM machine.

Supplemental light sources used to illuminate an area adjacent to an ATM may fail. All electrical light sources eventually burn out. Generally there is no way to know when the light source will fail. Even a systematic program of periodic replacement of light sources will not prevent a light bulb or other light source from failing prematurely.

Light sources are also subject to damage or failure due to other causes. Damage may result from wind or hail storms, or freezing and thawing cycles. Light sources may be damaged by vandals. Of course, conventional electrical light sources will temporarily fail to operate if there is a power outage.

The effectiveness of light sources may also change over time. Some types of lights produce less light with age. Changes in the seasons can modify the effectiveness of light sources. Factors such as the phase of the moon, the presence of leaves on trees, the presence of water or snow on the ground and the presence of insects in proximity to light sources impact light intensity. Similarly changes in surrounding conditions and the growth of vegetation can modify light intensity.

Numerous approaches have been taken to detecting lighting failures and reporting conditions. European Patent 0 236 147 describes a system for determining when a street light is not operating. That system employs a logic unit operable in two different modes. In one mode, the logic unit determines sufficient light shortly after start up. A brief superimposed oscillating signal is provided on the power supply line to a controller for identifying the problem light. In the other mode, the logic unit places a signal on the power line when a photo sensor senses a drop in light intensity while the system is in operation.

U.S. Pat. No. 5,095,502 describes a similar system where the signal is sent on the power supply line. A controller determines which light is out based on the signal.

U.S. Pat. No. 5,619,185 relates to a home security system where a motion detector activates flood lights. The system includes a switch or alternatively a photo detector for detecting if the bulbs have been loosened or removed. The system provides an audible alarm and a signal transmitted via RF, IR or an AC line to a remote location.

U.S. Pat. Nos. 4,462,022 and 4,507,654 describe a wireless security system that can communicate with a central station in the event of a security violation. The central station includes a memory which receives and stores signals and identification codes from remote sensors. Periodically, a microprocessor in the central station interrogates its associated memory to determine that all remote sensors have reported in. The remote sensors utilize infra red (IR) optical detectors in conjunction with a radio frequency (RF) transmitter.

At present, there exists a need for improved systems which enable an operator of an ATM, other automated transaction machine or other device to be aware that a light source has failed. While periodic checks of the area that is illuminated may be conducted to assure that all light sources are working, there is always a risk that a light source may be inoperative or of diminished in intensity or effectiveness for a substantial period before the failure is detected. If a light source becomes temporarily inoperative because of a loss of electrical power, there are currently not totally satisfactory systems available that alert the operator of the ATM of this condition.

Thus, there exists a need for a light monitoring system, including a system that is capable of being incorporated directly into the automated transaction machine, which monitors light levels in the area adjacent to the automated banking machine and which provides an indication when the light level has fallen below a predetermined level. Preferably, such a system would include the ability to interact with the automated banking machine to generate an "out-of-service" message to a user, or even signal the operator when necessary.

DISCLOSURE OF INVENTION

It is an object of the present invention to provide a light monitoring system.

It is a further object of the present invention to provide a light monitoring system incorporated in an automated transaction machine.

It is a further object of the present invention to provide a light monitoring system for monitoring light levels adjacent to an automated transaction machine.

It is a further object of the present invention to provide a light monitoring system which provides an indication when the light level adjacent to an automated transaction machine has fallen below a threshold.

It is a further object of the present invention to provide a light monitoring system for an area adjacent to an automated transaction machine that minimizes the risk of false indications of a light source failure.

It is a further object of the present invention to provide a light monitoring system for an area adjacent to an automated transaction machine that includes a plurality of light sensors, each of which is tailored to its particular location in the area.

It is a further object of the present invention to provide a light monitoring system for an area adjacent to an automated transaction machine, that is economical to install and operate.

It is a further object of the present invention to provide an interactive light monitoring system built directly into an automated transaction machine.

It is a further object of the present invention to provide an interactive light monitoring system for an automated transaction machine that includes an ambient light sensor in combination with directed sensors.

It is a further object of the present invention to provide an interactive light monitoring system for an automated transaction machine that is capable of taking corrective action in response to signals therefrom.

It is a further object of the present invention to provide a light monitoring system for an automated transaction machine that includes remote sensor units with visual indicators and/or audio to identify the unit generating the signal.

It is a further object of the present invention to provide a light monitoring system for an automated transaction machine that includes a threshold adjustment device for determining when the signal is given.

It is a further object of the present invention to provide a light monitoring system for an automated transaction machine that includes a timer to provide a delay for the sensors giving a signal after initially sensing a diminishment in light level to minimize false signals.

It is a further object of the present invention to provide a light monitoring system that is easier to set up and configure.

It is a further object of the present invention to provide a light monitoring system that provides increased reliability in operation.

It is a further object of the present invention to provide a light monitoring system that minimizes the risk of giving false low light indications.

It is a further object of the present invention to provide a method of operating and installing a light monitoring system.

It is a further object of the present invention to provide a method for monitoring light levels in an area adjacent to an automated transaction machine.

Further objects of the present invention will be made apparent in the following Best Modes for Carrying Out Invention and the appended claims.

The foregoing objects are accomplished in an exemplary embodiment of the invention by a light monitoring system for monitoring light levels adjacent to an automated transaction machine or other device or installation. The system includes one or several light sources for illuminating the area adjacent to the automated transaction machine. A light sensor is positioned in a location in which it is enabled to sense light levels in the area illuminated by the light source. The light sensor is part of a remote unit which includes a wireless transmitter. The remote unit transmits a signal when the light level is detected as falling below a threshold.

The system further includes a receiver for receiving the wireless signals transmitted by the remote unit. The receiver receives the signals and gives an indication at a monitoring station of the low light condition. This enables a person operating the transaction machine to promptly take appropriate action. Alternatively or in addition the transaction machine may go out of service in response to the low light condition being sensed and/or may provide an indication that it is out of service or provide another appropriate message through its screen or other output device.

BEST MODES FOR CARRYING OUT INVENTION

Figure 1:
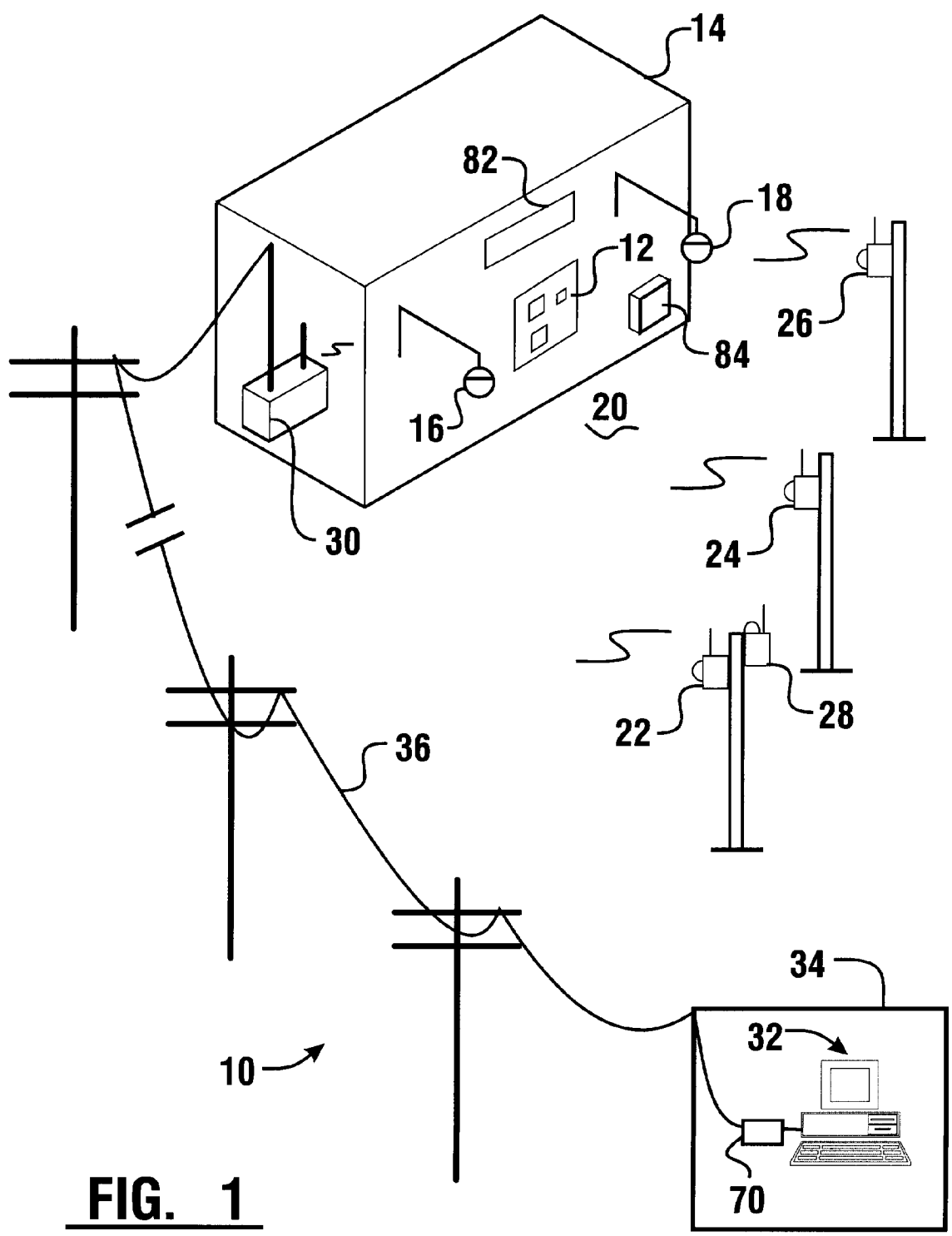
FIG. 1 is a schematic view of a light monitoring system of the present invention for monitoring light levels in an area adjacent to an automated transaction machine.

Referring now to the drawings and particularly to FIG. 1, there is shown therein a system of one exemplary embodiment of the present invention, generally indicated 10. The system includes an automated transaction machine 12. Machine 12 in the embodiment shown is an automated teller machine (ATM) mounted in a through-the-wall configuration. The ATM is mounted in an exterior wall of a structure 14. Structure 14 may be a bank building or other type of building. Alternatively, structure 14 may be an island structure in which the ATM is installed. It should be understood that while in the embodiment shown the ATM is mounted in a through-the-wall configuration, in other embodiments other configurations may be used including without limitation an ATM mounted in a lobby or a through-the-wall configuration within a vestibule that is accessible by customers either from the outside or the inside of a building structure. Of course in alternative embodiments the transaction machine involved may be other than an ATM, or principles of the system may be applied in other environments.

A light source comprised of a light 16 and a light 18 illuminate an area generally indicated 20. Illuminated area 20 includes an area occupied by a customer when operating the ATM 12. It should be understood that while in the preferred embodiment a pair of lights are shown which would generally illuminate an area directly in front of machine 12, in other embodiments one or a plurality of lights in various locations along a path, throughout a parking lot, along the underside of a drive through or walk through facility, and/or lights in a surround or similar structure may comprise the light source.

System 10 further includes remote units 22, 24 and 26. The remote units operate in a manner later discussed to sense light levels at their respective locations in area 20. It should be understood that while in the embodiment shown three remote units are used, in other embodiments any number of remote units may be used. The system further includes an ambient light sensor unit 28. The ambient light sensor unit 28 is operative to sense the level of ambient light generally coming from sources other than lights 16 and 18. Sensor unit 28 operates in a manner later discussed to determine if the system is operating in day or night conditions and to enable the system to operate in an enable mode in appropriate circumstances.

The system further includes a control unit 30. Control unit 30 is preferably mounted inside structure 14, and may be incorporated within ATM 12. As later discussed, control unit 30 is in operative connection with a communications device which enables the control unit to communicate with a monitoring unit 32. Monitoring unit 32 is preferably located remotely from structure 14 in a remote structure 34. The monitoring unit is preferably positioned in a location which is monitored by or for the operator of the ATM on a generally continuous basis during evening hours.

The monitoring unit 32 may be a unit of the type that is used to monitor for alarm conditions such as break-ins or other improper activities within the bank or other facility which includes the ATM. Alternatively the control unit may be a remote computer which operates the ATM. The control unit 30 is preferably enabled to communicate with the monitoring unit 32 via a remote communications method. Although a telephone line 36 is indicated as the method of communication in the embodiment shown, in other embodiments this communication may be by other wire or wireless methods.

Alternatively the remote unit may be connected to the automated transaction machine through a local area network or a wide area network such as the Internet. The remote station may communicate with a server operated in the ATM or control unit 30 through a TCP/IP connection or similar network connection. In such embodiments the server may provide messages indicative of status information of devices associated with the ATM including light monitoring devices. This may be done in the manner similar to that described in connection with conditions or operation of devices in an automated transaction machine as described in published International Application No. PCT/US97/21422 International Publication No. WO 98124041 which is owned by the assignee of the present invention and which is incorporated herein by reference as if fully rewritten herein.

In the described form of the invention the remote units are generally the same in overall structure. Therefore, only remote unit 22 shall be described in detail. As shown schematically in FIG. 2, the remote unit has a case 35 with a removable cover 37 that enables accessing its interior components. Remote unit 22 includes a power source 38. The power source 38 preferably provides power at a level suitable for use by the other components which make up the remote unit. The power source preferably is a replaceable battery. Alternatively, the remote unit may derive power from a locally accessible AC line, and may include a rechargeable battery or other independent source of power so that the remote unit may operate when its usual source of power is cut off. Remote unit 22 further includes a light sensor schematically indicated 40. Light sensor 40 is preferably a photoelectric sensor that produces signals in response to the amount of light which falls on the sensor. In the preferred embodiment, light sensor 40 is a photocell type sensor. The photocell type sensor is positioned in this exemplary embodiment so as to extend through an opening in the cover 37 when the cover is installed.

Sensor 40 is connected to signal conditioning circuitry schematically indicated 42. The signal conditioning circuitry preferably receives the signals from the sensor 40 and modifies the signals in a manner suitable for processing by the other components in the remote unit. Signal conditioning circuitry 42 may include, for example, an amplifier for amplifying the signals and certain filters for eliminating noise and other extraneous signals. In addition, circuitry 42 may include an analog to digital convertor for converting the signals from the sensor 40 to a digital output. The particular type of signal conditioning circuitry required will depend on the nature of the components used in the remote unit.

Remote unit 22 further preferably includes a threshold storing and comparing device schematically indicated 44. Device 44 further includes a threshold adjustment device schematically indicated 46. The threshold adjustment device 46 operates to selectively set a threshold for comparison to the light level sensed by sensor 40. When the light level falls below this threshold in this exemplary embodiment an alert signal will be generated.

Remote unit 22 also preferably includes a timer 48. Timer 48 preferably includes a timer adjustment device schematically indicated 50. The timer adjustment device is preferably used in connection with the timer 48 to set one or more time periods. A time period set in the described embodiment includes a period of time which the level of light sensed by sensor 40 must be below the set threshold before a signal indicative of a low light level will be given. In the described embodiment, the timer 48 is used to minimize the risk that a false indication will be given of a failure of a light source in the event of a brief drop in the amount of light reaching the sensor. Such a brief drop in light level may occur, for example, due to shadows, leaves or other temporary obstructions or brief power outages. Timer 48 can also eliminate false indications or cycles during a thunderstorm for example.

Another time period set in this exemplary embodiment is a time period that a light level above the threshold must be restored before the remote unit changes its condition to indicate that it is no longer sensing a low light condition. This feature similarly minimizes the risk that the remote unit will change its indication from low light to adequate light in response to transient conditions such as headlights, search lights or other short term influences. In one exemplary embodiment the timer is operative to delay giving a low light indication unless a light intensity below the threshold is sensed generally continuously for about ten minutes, and the timer is operative to delay giving an indication of adequate light unless the light intensity is above the threshold for about five minutes. Of course other time periods may be used. It should further be understood that while in the exemplary embodiment described herein signals are generated by the remote units responsive to comparison of light intensity to a single threshold, in other embodiments there may be a plurality of thresholds for purposes of indicating a plurality of conditions. For example there may be one threshold for determining insufficient light intensity and a different threshold for indicating adequate light intensity. Additional thresholds may also be provided and additional conditions indicated responsive to sensing light intensities relative to the thresholds.

The exemplary embodiment further includes a cover switch 51. Cover switch 51 is operative to sense when cover 37 of the enclosure is removed. The condition of cover switch 51 in this embodiment is operative to affect operation of timing device 48 relative to the other circuitry. In this exemplary embodiment when cover switch 51 indicates that cover 37 has been removed, as would be the case during a system set up activity, the time delays associated with the remote unit giving an indication of a low light condition and/or an adequate light condition are substantially reduced. This enables a service person to adjust and set the threshold (s) without having to wait for the time delay periods to determine the result of such adjustment. Preferably the signals indicative of light intensity relative to the set threshold(s) are provided to service persons quickly so further adjustments can be made. Once the adjustments are made and cover 37 reinstalled, cover switch 51 causes the remote unit to again operate using the time delays.

It should be understood that while a cover switch is used in the described embodiment as a circuit element for reducing time delays during system set up, in other embodiments other elements may be used for this purpose. Some such elements may be configured to avoid the need to access the interior of the remote unit for activation and deactivation of one or more time delays.

It should be understood that in some alternative embodiments of the remote units used in connection with the invention, the threshold device 44 and the timer 48 may not be included. In some alternative embodiments, no time delay may be required before a signal is given. In some alternative embodiments, the threshold may be a permanently set value and/or may include a compensation mechanism for compensating in operation of the device for transient conditions such as moonlight, snow or lightning flashes in a thunderstorm. In some alternative embodiments, the signal conditioning circuitry 42 may provide an output from the remote unit 22 which is proportional to the light level with appropriate compensation factors when desired, and the functions provided by the threshold comparison and adjustment device and/or the timer may be provided in control unit 30 or by devices elsewhere in the system.

In one exemplary embodiment of remote unit 22, an indicator 52 is provided. Indicator 52 may be an LED or similar visual indicator. Indicator 52 may alternatively be an audio indicator or other type indicator that can be readily perceived or sensed by humans or a sensing device. The indicator 52 preferably indicates when the unit 22 is giving a first signal indicative that the light sensed has fallen below the set level. This is done in the exemplary embodiment by the indicator giving a first pattern of flashes. Indicator 52 is useful in setting up the system as well as in troubleshooting the system. Alternatively or in addition indicator 52 may give other indications as well. For example indicator 52 may provide a second pattern of flashes responsive to the unit giving a second signal indicative that light sensed is above the threshold. Further indications may be given responsive to other sensed conditions, for example a low battery condition.

Remote unit 22 further includes a wireless transmitter device schematically indicated 54. Transmitter device 54 in the described embodiment is an RF type transmitter. However, in other embodiments other means for communicating between the remote units and the control unit 30 may be used. Such alternative communication methods may include, for example, providing infrared, sonic, ultrasonic or other types of signals. Transmitter 54 preferably outputs a signal when the light level sensed by sensor 40 has generally continuously been below the threshold set in the threshold device 44, for a time period that is greater than the corresponding period set in the timing device 48. In one preferred form of the invention, the transmitter produces a signal that is unique to the particular remote unit 22. This enables the operator of the system to know which remote unit is no longer sensing the required amount of light. In alternative embodiments, each of the remote units may produce a similar signal and the indicators 52 may be inspected to determine which of the remote units is producing the signal.

The remote units 22 may take various forms. The units may be essentially hardwired or in alternative embodiments may be processor based. Such an alternative form of a remote unit is indicated schematically in FIG. 2, in which the unit includes a processor 56. Processor 56 is in operative connection with a data store schematically indicated 58. Data store 58 is suitable for holding programs, instructions, control logic, thresholds, self-diagnostics, or other values or data used in operation of the unit. The processor 56 communicates through interfaces schematically indicated 60 with other components of the unit such as the sensor 40 and the transmitter 54.

In such a processor based alternative embodiment, components such as the threshold adjustment device 46 and the timer adjustment device 50 may be replaced by programmable thresholds and time periods stored in the memory 58. Further, in some alternative embodiments, remote unit 22 may also include a receiver in addition to a transmitter. The receiver may be used to receive data that is used to program and/or change threshold or other values stored in the memory 58. This feature may be particularly desirable where remote units are positioned in locations that are not readily accessible by service personnel. Alternatively, such remote programming capability may be desirable when lighting conditions in the area being monitored are likely to change on a fairly frequent basis.

In embodiments of the invention the remote units may further include environmental control components within the case 35. Such environmental control components schematically indicated 61, may include one or more articles or devices for controlling or maintaining suitable conditions within the case for operation of the components therein. In the exemplary embodiment the remote units are designed for outdoor installation and each unit is preferably generally weatherproof when the cover is installed. However exposure to weather conditions or human error can result in moisture penetrating or condensing in the interior of the case. To combat such conditions the environmental control components may include a desiccator. This may include for example a replaceable container holding a desiccant. The desiccant container in one exemplary embodiment includes a desiccant material in a bag. Periodically or when the case is opened for servicing, the existing desiccant container may be removed and a new one installed. Alternatively the existing container may be reactivated to increase its moisture absorbing capability. This may be accomplished such as by heating or other treatment and the container reinstalled in the same or another unit.

Other environmental control components may be included in alternative embodiments. These may include for example heaters, coolers, fans, vents, drains and other devices. Such devices may be operated responsive to appropriate sensors and control devices to maintain conditions in the interior of the units within a desired range. The types of environmental control components included will depend on the ability of the components in the remote unit to tolerate extremes of environmental conditions. In some embodiments no environmental control components may be needed.

Figure 3:
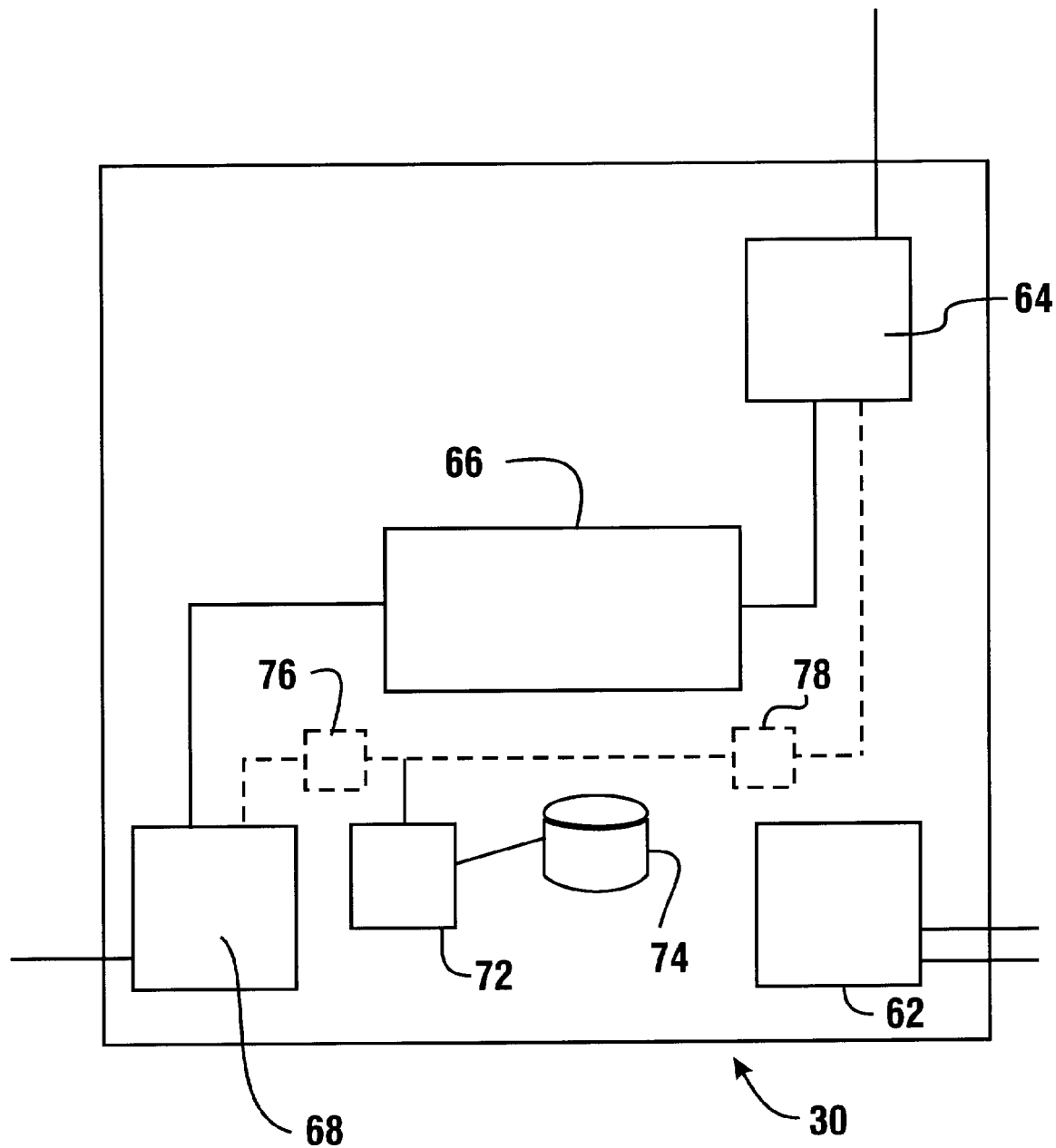
FIG. 3 is a schematic view of a control unit used in the system shown in FIG. 1.

The control unit 30 is schematically shown in FIG. 3. The control unit 30 preferably includes a power supply 62. The power supply 62 preferably receives power from an AC source. However, in the event that the power source should sustain an outage, power supply 62 preferably includes a rechargeable battery or similar device for continuing to operate the system.

Control unit 30 preferably includes a wireless receiver 64. Receiver 64 is an RF type receiver in the exemplary embodiment. However, in other embodiments other types of wire or wireless receivers compatible with the transmitters in the remote units may be used. Receiver 64 is in operative connection with control circuitry 66. The control circuitry 66 is operative to set the system in either an enabled condition or a standby condition. This is done based on signals from the ambient light sensor unit 28 in a manner later discussed. Control circuitry 66 is further operative when the system is in an enabled condition to produce signals which are transmitted through a communications device 68 to the monitoring unit 32. As shown schematically in FIG. 1, the monitoring unit 32 is in connection with a communications device 70 that enables receiving communications from the control unit 30. In one exemplary embodiment of the invention, the communications devices 68 and 70 are modems which enable communication via phone line 36. Of course, in other embodiments other methods of communication between the control unit and the remote monitoring unit may be used, including those approaches previously discussed herein.

As schematically indicated in FIG. 3, alternative embodiments of the control unit may be processor based. Such embodiments may include a processor 72 which is in operative connection with a data store 74. The data store is used for holding programs, instructions, stored values and other information. The processor is in communication through interfaces 76, 78 with the other components of the control unit such as receiver 64 and communications device 68. The alternative embodiment may operate to use the processor 72 to carry out the functions of the control circuitry 66. As previously discussed in alternative embodiments may comprise a server suitable for communication through a network with other devices.

While in the previously described embodiment the control unit 30 includes only a receiver, alternative embodiments may also include a transmitter. The transmitter may be used for sending instructions and information to the remote units and the ambient light sensor unit. Such instructions may include changes to programs as well as changes in threshold values and time periods and other values. As previously discussed in connection with the alternative form of the remote units, the capability of remotely programming the remote units may be useful in some situations.

Figure 2:
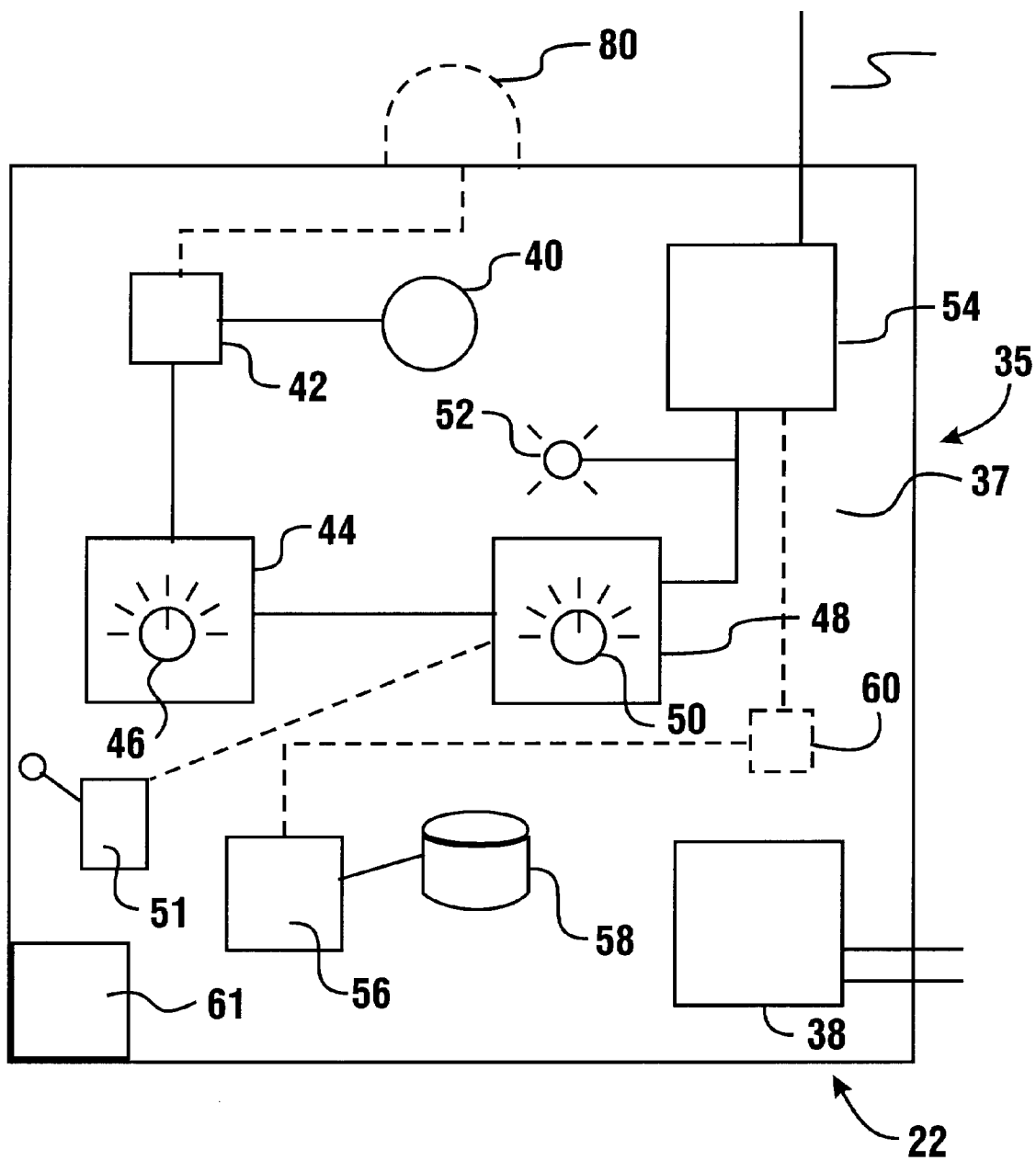
FIG. 2 is a schematic view of a remote unit used in the system shown in FIG. 1.

In one exemplary form of the invention, the ambient light sensor unit 28 is generally similar in structure and operation to the remote units. As described in connection with FIG. 2, the ambient light sensor unit includes an alternative sensor 80 instead of the sensor 40. In the exemplary form of the invention, sensor 80 may include a photocell or similar light level sensor. Sensor 80 is preferably oriented by the mounting of the associated case 35 or is otherwise constructed to sense light from ambient sources generally other than the supplemental light source which illuminates the area adjacent to the ATM. In this way the ambient light sensing unit 28 is able to distinguish between daylight and nighttime conditions. As shown in FIG. 2, sensor 80 may be oriented upward so as to be directed away from the light source illuminating area 20. Alternatively, shrouds or other methods for assuring the sensing of ambient light may be used. In some embodiments unit 28 may be similar to the remote units and set or programmed with appropriate thresholds for distinguishing day and night lighting conditions.

In the exemplary embodiment of the ambient light sensor 28, the light level thresholds are preferably set to a level which is indicative of when the system of the preferred embodiment should commence operation monitoring light levels. An exemplary setting would be about seven foot candles. Further, the timer in the ambient light sensor unit 28 may be set to a time period which is sufficiently long so as to indicate that evening or other sustained period of reduced light levels has arrived so that the system should be turned on and placed in the enabled condition. About ten minutes would be a suitable time period for this purpose in some embodiments. The ambient light sensor unit 28 of the exemplary embodiment preferably outputs at least one wireless operation signal that is distinguishable from those output by the remote units. In this way the control unit 30 may respond to the first signal from the ambient light sensor unit by placing the system in an enabled condition. When ambient light levels subsequently increase for a suitable period the unit 28 of the exemplary embodiment outputs a signal which causes the control unit to return the system to the standby condition. In the exemplary embodiment unit 28 outputs a second signal after sensing light levels above the threshold for a generally continuous period of about five minutes, but in other embodiments other approaches may be used.

In operation of the system of one exemplary embodiment, the light sources 16, 18 are positioned to illuminate area 20. The control unit 30 is preferably installed within the structure 14 and is connected so as to enable it to communicate with the monitoring unit 32 at the remote location 34.

One or more remote units 22, 24, 26 are positioned at locations and sense the light levels within area 20. The ambient light sensor unit 28 is positioned so that it is enabled to sense the level of ambient level from sources generally other than the light source 16, 18 which are specifically arranged for illuminating area 20.

In operation of the exemplary system, the control circuitry 66 of the control unit 30 generally maintains the system in an inoperative, standby condition whenever the ambient light levels are generally above the threshold set in the ambient light sensor unit 28. As a result, during daylight conditions, extraneous radio signals or other signals are less likely to cause the system to provide a false indication of a problem.

With the approach of evening, the ambient light levels fall and this is sensed by the ambient light sensor unit 28. When the light level has fallen below the threshold set in the unit 28 and remains below the threshold generally continuously for the set period of time (for example ten minutes), unit 28 provides an operation signal from its transmitter. The signal is received by the receiver in the control unit 30 and the control circuitry in the control unit enables the operation of the system. The system remains operational until the ambient light sensor unit senses ambient light levels above the threshold and such light levels are maintained for more than the set period of time (for example five minutes) indicating the arrival of daylight. The ambient sensing unit 28 then gives a second operation signal which is received by the control unit, and the control unit returns to the inoperative standby condition.

While operation of the system is enabled, each of the remote units senses a light level falling on its respective sensor from the light source illuminating area 20. If the light source should fail, either completely or partially, the light falling on the sensor of at least one of the remote units will fall below a threshold set therein. If this condition persists generally continuously for the time period set in the timer of the remote unit (for example ten minutes), the remote unit transmits a first alert signal to the control unit 30. The control unit 30 operates to communicate a condition signal to the remote monitoring unit 32 which serves as an indicator device to indicate that a possible problem with a light source has been detected. The operator of the system may then take appropriate action to either determine the cause of the problem and/or correct the condition which is causing the signal to be generated.

It should be understood that in the preferred embodiment of the invention, each of the remote units may have an independently set threshold and time period. This enables tailoring each remote unit to its particular location in the area. This feature can also be used to reduce the risk of giving false indications as the result of shadows or other transient conditions which may occur in the location in which a remote unit may be positioned.

As previously discussed, alternative embodiments of the invention may enable changing the programming of the remote units and the ambient light sensor unit from a remote location. This may be done using devices within the control unit 30 or alternatively using a portable wireless programming device. In such alternative embodiments, modifications to the programming may be downline loaded from an input device in connection with the monitoring unit 32.

In addition to indicating possible conditions at the monitoring unit 32, alternative embodiments may be operated to take corrective action. For example, auxiliary lighting schematically indicated 82 may be installed adjacent to area 20. Such auxiliary lighting may be controlled either by the control unit 30 or from remote unit 32 in the event a possible problem is detected. The continued indication of a low light level condition after auxiliary lighting is turned on can be used in connection with appropriate instructions or circuitry in the control unit 30 to identify a system malfunction. A message indicative of a system malfunction may be communicated to monitoring unit 32 or to another monitoring unit in a connected network or system. Likewise if the remote units sense that proper lighting is restored the remote units send a second alert signal to the control unit. The control unit is then operative to send a correction signal to monitoring unit 32 to indicate the restoration of light levels. An auxiliary power supply schematically indicated 84, may be operatively connected to the light sensors so that auxiliary power or emergency power is delivered to the ATM 12 and/or the auxiliary lights 82 in response to the sensing of low light levels, such as those caused by a power outage. Numerous alternative approaches for using the system of the invention may be devised by those skilled in the art from the teachings provided herein.

Alternative forms of the invention may provide for the transmission of further signals from the remote units. These may include for example a further signal that is produced when the battery condition is sensed as low. Such a condition may result in a signal being sent to the control unit 30 or to another receiver. The control unit preferably operates to provide a message to the monitoring unit 32 to indicate the need for battery replacement in the remote unit. The signal provided by the remote unit may be of a different frequency or signal type which identifies the signal as a low battery signal. Preferably the signal includes an aspect or component that can be used to identify the particular remote unit causing it to be generated. This information may be interpreted or otherwise processed by the control unit, remote unit or other connected device to indicate the unit requiring battery replacement. As previously discussed the indicator on the affected unit may also output a pattern which identifies it as the unit generating a low battery signal.

Remote units may also provide other signals indicative of conditions requiring attention. This can be done based on appropriate sensors, circuitry and programming in the remote units. For example dirt may collect on a light sensor 42. This may cause the remote unit to lose sensitivity. The remote unit may be programmed to sense the range of light intensities within a given time window. For example, failure to sense light intensity above a given level within a period of several days or weeks suggests that an accumulation of undesirable material on the light sensor (or perhaps sensor deterioration) has occurred. The remote unit can detect such a failure and provide a signal to the control unit or other unit indicative of its need for cleaning or repair. In addition or in the alternative, the remote unit may be programmed or otherwise configured to modify one or more of its set thresholds responsive to the diminished light sensing capacity. This enables the remote unit to continue to operate until cleaning or repairs are conducted.

A method of setting up the system of the exemplary embodiment is now discussed. The remote units are positioned to sense light from the light sources so that a total or partial failure of the light sources is detected. The ambient light sensor is positioned and set to distinguish day and night conditions in the area of the automated transaction machine.

The system set up activity is preferably done in full night conditions, optimally more than one hour after sunset and more than one hour before sunrise. The light sources for illuminating the area should be fully operative.

To set the threshold on a remote unit the cover is removed. This triggers cover switch 51 to avoid the time delays normally associated with giving signals. A filter is then selectively placed in overlying relation of the light sensor 40. This filter reduces the light falling on the sensor from the light sources. The threshold is then adjusted by adjusting the threshold adjusting device 46. In the described approach the threshold is adjusted so that the low light signal is not generated when the filter is installed. This is done by adjusting device 46 so the low light indication is given initially by indicator 52. Adjustment of the threshold is then made downward until the low light indication is no longer given.

The filter is then removed from overlying relation with the light sensor and/or with the filter still installed, a blocking device is positioned in overlying relation of the light sensor 40. This blocking device may be a technician's finger, an adhesive bandage or other device suitable for blocking passage of generally all light to the sensor. The operation of the remote unit is verified in this condition by the indicator 52 flashing the low light indication. If the indication is not given there is a problem and the procedure may be repeated to position the threshold close to the level of light that the filter allows to pass. Although the signals are indicated by the indicator 52 an RF receiver for the signals may also be used by a technician to sense operation of the remote units.

In one exemplary embodiment the filter reduces the amount of light that reaches the light sensor by about 25%. This is generally sufficient to set the threshold sufficiently disposed from the current light level intensity so that a minor reduction in light intensity does not result in a false indication of light source failure. For example, if a change in the phase of the moon, foliage growth, change in reflectance due to snow, rain or structure coloration, aging of light sources, accumulation of dirt, insects or other factors results in a remote unit sensing less than the amount of light sensed at the time of set up, a signal indicative of light source failure is generally not given. This is because at least a 25% reduction in available light is required to cause the first signal to be generated and factors other than light source failure will generally not cause such a loss.

Alternative set up techniques may employ different system filters. Such filters could provide different levels of light attenuation. For example, one filter could provide about 25% light attenuation and another could provide a greater amount of attenuation, for example 50%. In setting up a remote unit the 50% filter may be used instead of the blocking device. The threshold adjustment could be made so that a 25% filter does not cause a low light signal while the 50% filter does. In this way the exact threshold is more readily set. Likewise an adjustable type polarizing filter or other filters or devices capable of delivering selective amounts of light intensity may be used to position the threshold (or thresholds) for giving signals as desired. It should further be understood that while in the described embodiment each light level sensing device is set to provide an alert signal at a different light intensity threshold, in other embodiments the sensing devices may be set at the same threshold.

Figure 4:
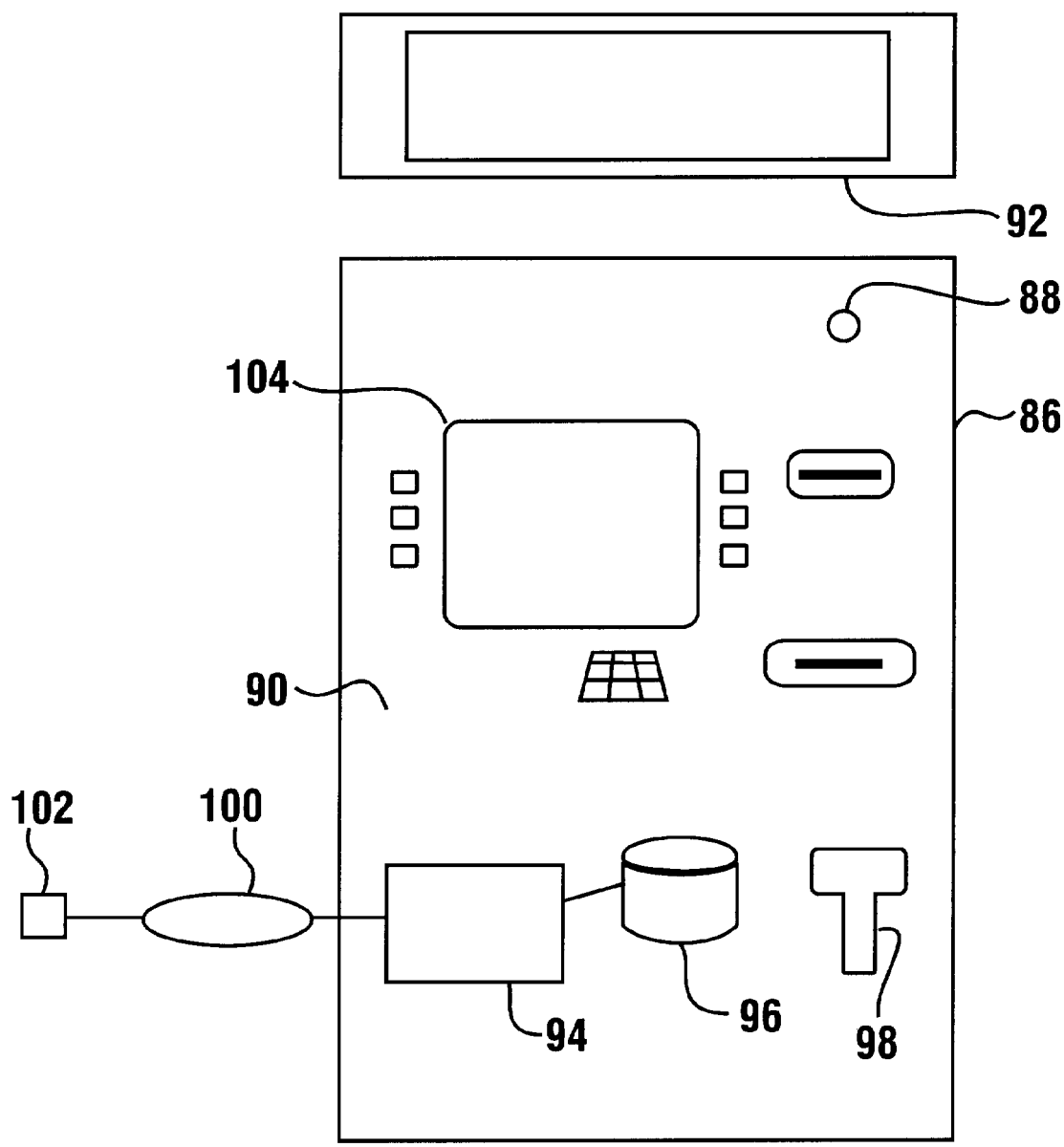
FIG. 4 is an alternative embodiment of a system of the invention.

An alternative embodiment of the invention is shown schematically in FIG. 4. In the embodiment shown in FIG. 4 a banking machine 86 includes a light sensor 88 mounted thereon. The light sensor 88 is mounted in a location on a fascia 90 of the machine or other location on or in the machine where it is positioned to detect light levels. A light 92 is positioned adjacent to the banking machine 86 to provide lighting for operation of the machine during evening hours.

The banking machine 86 includes a control unit 94 therein. The control unit 94 in the preferred embodiment is a processor which has an associated memory schematically indicated 96. The control unit 94 is in operative connection with the light sensor 88. The control unit 94 is also in operative connection with other sensors and detectors such as a seismic detector schematically indicated 98. The control unit 94 may in some embodiments include the computer which operates the transaction components of the automated banking machine such as the card reader, cash dispenser, printer and display. In other embodiments the control unit 94 may be a separate processor or a separate server suitable for handling alarm and other status messages. The control unit 94 is in operative connection with a communications system schematically indicated 100. Communications system 100 may be a lease line, telephone line, intranet, wide area network or other connection which enables the banking machine 86 to communicate with a remote computer schematically indicated 102. Remote computer 102 may be located at a bank or other remote processor. Computer 102 communicates messages with the banking machine through the communications system 100.

In operation of this embodiment the light sensor 88 is operative to sense light from the adjacent light source 92. In the event that light is no longer sensed for a period of time which suggests that there is a problem, the control unit 94 is operative to generate a status message indicative of a low light level. This status message is sent by the banking machine to the remote computer 102 through the communications system 100. In a preferred embodiment the control unit is also operative to cause a screen 104 or other output device on the banking machine to provide an "out of service message" or other appropriate visible message to advise a user that the banking machine is not in service. Such an output will advise a user not to attempt to operate the machine. The status message sent to the remote computer can also be routed to appropriate personnel who can take steps to correct the problem. Displays for screen 104 may be reproduced by the control unit from the data in memory 96.

In alternative situations vandals may attempt to attack the banking machine by tearing the machine from its adjacent wall or other mounting. When this occurs the sensing of light by the light sensor 88 will generally be discontinued and the seismic detector 98 will sense the vibration or movement associated with the attack on the machine. In alternative embodiments the control unit 94 responds to its programming and the sensing of both of these conditions to provide a status message to the remote computer 102 which is indicative that the machine is under attack. Such a message will advise the operator of the ATM of the problem. Alternatively combinations of alarm or other status conditions may be selectively routed by the control unit 94 or the remote computer 102 to other computer stations where the persons responsible for responding are located.

In the alternative embodiment shown in FIG. 4 the system may include an ambient light sensor located remotely from the light source 92 so as to sense the changes from day to night conditions. It should be understood that the ambient light sensor as well as light sensor 88 may work in conjunction with timing devices and other devices similar to the previously described embodiment so as to enable the system only during evening hours. Alternatively the embodiment shown in FIG. 4 may use a system clock which operates in the control unit 94. The system clock may work in conjunction with data stored in the memory 96 concerning sunrise and sunset times so as to enable operation of the system only during evening and twilight hours and to disable operation of the system during other times. It should further be understood that while the light sensor 88 is shown in FIG. 4 as positioned on the fascia of the automated banking machine in other embodiments the light sensor may be disposed adjacent to the machine and connected thereto if required for properly sensing the adjacent light source.

While the described embodiments of the invention have involved sensing light levels adjacent to automated transaction machines, embodiments of the invention may also be used in connection with other types of devices or facilities to provide an indication when light levels therein fall below a desired level. Numerous variations will suggest themselves to those skilled in the art from the description of the invention provided herein. Descriptions concerning the exemplary embodiments are not to be deemed limiting of the scope of Applicants' claimed invention.

Thus, the new light monitoring system for automated banking machines of the present invention achieves the above stated objectives, eliminates difficulties encountered in the use of prior devices and systems, solves problems and attains the desirable results described herein.

In the foregoing description, certain terms have been used for brevity, clarity and understanding. However, no unnecessary limitations are to be implied therefrom because such terms are for descriptive purposes and are intended to be broadly construed. Moreover, the descriptions and illustrations given herein are by way of examples and the invention is not limited to the details shown and described.

In the following claims, any feature described as a means for performing a function shall be construed as encompassing any means known to those skilled in the art as being capable of performing the recited function and shall not be limited to the features shown in the foregoing description or mere equivalents thereof.

Having described the features, discoveries and principles of the invention, the manner in which it is constructed and operated and the advantages and useful results attained; the new and useful structures, devices, elements, arrangements, parts, combinations, systems, operations, methods and relationships are set forth in the appended claims.

We claim:

1. A system comprising:
   an automated transaction machine;
   a supplemental light source illuminating an area adjacent to the automated transaction machine;
   a first light level sensing device, wherein the first light level sensing device is operative to sense light intensity in the area generally from the supplemental light source, and wherein the first light level sensing device is operative to generate a first alert signal responsive to light intensity sensed by the first light level sensing device generally being below a first threshold;
   an ambient light level sensing device, wherein the ambient light level sensing device is operative to sense ambient light intensity generally from other than the supplemental light source, and wherein the ambient light level sensing device is operative to generate a first operation signal responsive to light intensity sensed by the ambient light level sensing device generally being below a second threshold;
   an indicator device in operative connection with the first light level sensing device and the ambient light level sensing device wherein the indicator device is operative to generate at least one condition signal responsive to generation of both the first operation signal and the first alert signal.

2. The system according to claim 1 wherein the ambient light level sensing device is further operative to generate a second operation signal responsive to light intensity sensed by the ambient light level sensing device generally being above a further threshold, wherein the indicator device is operative responsive to generation of the second operation signal to not generate the condition signal responsive to generation of the first alert signal.

3. The system according to claim 2 wherein the further threshold generally corresponds to the second threshold.

4. The system according to claim 1 wherein the first light level sensing device includes a first timing device, wherein the first timing device is operative to determine a first alert signal delay period, and wherein the first alert signal is generated responsive to the first light level sensing device sensing light intensity below the first threshold generally continuously for the first alert signal delay period.

5. The system according to claim 1 wherein the first light level sensing device is further operative to generate a second alert signal responsive to sensing light intensity above the first threshold, wherein the indicator device is operative to generate a correction signal responsive to the generation of the second alert signal subsequent to the condition signal.

6. The system according to claim 5 wherein the first light level sensing device includes a first timer, wherein the timer is operative to determine a second alert signal delay period, wherein the second alert signal is generated responsive to the first light level sensing device sensing light intensity above the first threshold generally continuously for the second signal delay period.

7. The system according to claim 4 wherein the first light level sensing device includes first threshold adjusting device, wherein adjustment of the first threshold adjusting device is operative to adjust the first threshold, and wherein the first light level sensing device includes a time delay reducing switch, wherein the first alert signal delay period is substantially eliminated responsive to activation of the time delay reducing switch.

8. The system according to claim 7 wherein the first light level sensing device includes a removable cover, and wherein the time delay reducing switch is in operative connection with the cover, wherein removal of the cover is operative to actuate the time delay reducing switch.

9. The system according to claim 1 wherein the ambient light level sensing device includes a timing device, wherein the timing device is operative to calculate a first operation signal delay period, wherein the first operation signal is generated responsive to the ambient light level sensing device sensing light intensity below the second threshold generally continuously for the first operation signal delay period.

10. The system according to claim 2 wherein the ambient light level sensing device includes a timing device, wherein the timing device is operative to calculate a second operation signal delay period, wherein the second operation signal is generated responsive to the ambient level sensing device sensing light intensity above the first threshold generally continuously for the second operation signal delay period.

11. The system according to claim 1 and further comprising a first wireless transmitter in operative connection with the first light level sensing device, and a wireless receiver in operative connection with the indicator device, wherein the first alert signal includes a first alert wireless signal transmitted from the transmitter to the receiver.

12. The system according to claim 1 and further comprising a second wireless transmitter in operative connection with the ambient light sensing device, and a wireless receiver in operative connection with the indicator device, wherein the first operation signal includes a first operation wireless signal transmitted from the second wireless transmitter to the receiver.

13. The system according to claim 12 and further comprising a first wireless transmitter in operative connection with the first light level sensing device, wherein the first alert signal includes a first alert wireless signal transmitted from the first transmitter to the receiver.

14. The system according to claim 1 and further comprising a plurality of first light level sensing devices, wherein each of the first light level sensing devices is positioned in a different location in the area, and wherein the indicator device is in operative connection with each of the first light level sensing devices, and the condition signal is given responsive to a first alert signal being given by any one of the first light level sensing devices.

15. The system according to claim 14 and further comprising a plurality of threshold adjustment devices, wherein each first light level sensing device is in operative connection with at least one threshold adjustment device, wherein each threshold adjustment device is operative to selectively set the first threshold for the associated first light sensing device, and wherein the condition signal is given by the indicator device responsive to any one of the first light level sensing devices sensing light intensity below the threshold set in the corresponding threshold adjustment device.

16. The system according to claim 15 and further comprising a plurality of first timers, wherein each first light level sensing device is in operative connection with one respective first timer, each first timer having a timer adjustment device, wherein the timer adjustment device is operative to selectively set a first alert signal delay period, and wherein the condition signal is given when the light intensity sensed by any one of the first light level sensing devices is below the first threshold associated with the one light level sensing device generally continuously for the first alert signal delay period set in the first timer corresponding to the respective first light level sensing device.

17. The system according to claim 16 and further comprising a wireless transmitter and a wireless receiver, and wherein at least one of the first light level sensing devices is in operative connection with the wireless transmitter, and the indicator device is in operative connection with the wireless receiver, and wherein a signal is given by the wireless transmitter to the wireless receiver when the light intensity sensed by one first light level sensing devices is below the respective first threshold generally continuously for the respective set first alert signal delay period.

18. The system according to claim 1 and further comprising:
   a first structure, wherein the first structure houses the automated transaction machine; a control unit within the first structure, wherein the control unit is in operative connection with the first light level sensing device, and wherein the control unit is in operative connection with a first communication device;
   a monitoring unit remote from the control unit, the monitoring unit in operative connection with a second communications device, wherein the monitoring unit includes the indicator device, and wherein the control unit and the monitoring unit communicate through the first and second communications devices; and
   wherein when the light intensity sensed by the first light level sensing device sensor is below the first threshold, the control unit communicates with the monitoring unit and the first condition signal is given through the monitoring unit.

19. The system according to claim 18 wherein the monitoring unit is housed in a second structure remote from the first structure.

20. A method of operating the system recited in claim 1 comprising the steps of:
   illuminating the area adjacent to the automated transaction machine with the supplemental light source;
   sensing light intensity in the area with the first light level sensing device;
   generating with the first light level sensing device the first alert signal responsive to sensing light intensity in the area being below the first threshold; and
   indicating with the indicator device the first condition signal responsive to the first alert signal.

21. The method according to claim 20 and further comprising the steps of further sensing with the ambient light level sensing device ambient light intensity generally not provided by the supplemental light source, and placing the indicator device in enabled condition responsive to the first operation signal wherein the indicator device only provides the condition signal after the indicator device is in the enabled condition.

22. The method according to claim 20 wherein the system comprises a plurality of first light level sensing devices and wherein the sensing step comprises sensing light levels in a plurality of disposed locations in the area with the plurality of first light level sensing devices, wherein in the indicating step the condition signal is given when the light intensity sensed by any one of the first light level sensing devices falls below the first threshold.

23. The method according to claim 22 wherein each first light level sensing device is in operative connection with a corresponding threshold adjustment device, wherein the threshold adjustment device is operative to set a first threshold associated with corresponding first light level sensing devices, and further comprising the step of setting a first threshold for each first light level sensing device with the threshold adjustment device, and wherein in the indicating step the condition signal is given when the light intensity sensed by any one of the first light level sensing devices falls below the first threshold set for the corresponding first light sensor device.

24. The method according to claim 23 and further comprising the steps of:
   placing a filter to reduce light intensity sensed by one first light level sensing device;
   adjusting the corresponding threshold adjustment device for the one first light level sensing device so that the one first light level sensing device does not generate the first alert signal when the filter is in place;
   removing the filter so that it no longer reduces the light intensity sensed by the one first light level sensing device.

25. The method according to claim 20 and further comprising a timer in operative connection with the ambient light level sensing device, wherein the timer is operative to determine a first operation signal time delay period, and wherein in the indicating step the condition signal is generated only after the ambient light intensity is sensed by the ambient light level sensing device as below the second threshold generally continuously for the first operation signal time delay period.

26. The method according to claim 20 wherein the generating step further comprises the step of transmitting with a wireless transmitter to a wireless receiver a wireless signal.

27. The system according to claim 14, wherein each of the plurality of first light level sensing devices includes a visual indicator wherein the visual indicator indicates which one of the first light level sensing devices is generating a first alert signal.

28. The system according to claim 1 and further comprising an auxiliary light in operative connection with the indicator device, wherein the auxiliary light is switched on responsive to the first condition signal.

29. The system according to claim 1, wherein the automated transaction machine includes a screen, and wherein the automated transaction machine is in operative connection with the first light level sensing device and the ambient light sensing device, and wherein the automated transaction machine is operative to cause an out-of-service message to be produced on the screen on the automated transaction machine responsive to the generation of the first operation signal and the first alert signal.

30. The system according to claim 29 wherein the generation of the first alert signal and the first operation signal is further operative to cause the automated transaction machine to generate a status message indicative of an out of service condition, wherein the status message is communicated to a communication system in operative connection with the banking machine.

31. The system according to claim 1 and further comprising an auxiliary power source in operative connection with the automated transaction machine and wherein responsive to the generation of the first operation signal and the first alert signal the auxiliary power source is operative to supply power to the automated transaction machine.

32. The system according to claim 31 and further comprising an auxiliary light in operative connection with the auxiliary power source, wherein the auxiliary power source is operative to supply power the auxiliary light responsive to generation of the first operation signal and the first alert signal.

33. The system according to claim 15, and further comprising means for remotely programming each threshold adjustment device for the plurality of first light level sensing devices.

34. The system according to claim 1, wherein the first light level sensing device is situated in supporting connection with the automated transaction machine.

35. The system according to claim 16, and further comprising means for remotely programming each first timer for the plurality of the first light level sensing devices.

36. A system comprising:

an automated transaction machine operatively connected to a control unit which receives indication signals and provides output signals responsive thereto;

a supplemental light source illuminating an area adjacent to the automated transaction machine;

a first light level sensing device, wherein the first light level sensing device senses a light level in the area and produces a signal indicative thereof; and an indicator device in operative connection with the first light level sensing device and operative responsive to the signal therefrom, wherein the indicator device is in operative communication with the control unit and provides an indication signal to the control unit when the signal representing the light level sensed by the first light level sensing device falls below a first threshold value, and wherein the control unit is operative to generate an output signal responsive to the indication signal.

37. The system according to claim 36 wherein the transaction machine includes an output device, and wherein the output device is operative responsive to the output signal to indicate that the transaction machine is out of service.

* * * * *